(12) United States Patent  
Konishi (10) Patent No.: US 11,195,776 B2
(45) Date of Patent: Dec. 7, 2021

(54) POWER MODULE SUBSTRATE AND POWER MODULE (71) Applicant: KYOCERA Corporation, Kyoto (JP)

(72) Inventor: Yoshitada Konishi, Kirishima (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 16/627,099

(22) PCT Filed: May 22, 2018

(86) PCT No.: PCT/JP2018/019679
§ 371 (c)(1),
(2) Date: Dec. 27, 2019

(87) PCT Pub. No.: WO2019/003725
PCT Pub. Date: Jan. 3, 2019

(65) Prior Publication Data
US 2020/0135612 A1  Apr. 30, 2020

(30) Foreign Application Priority Data

Jun. 28, 2017 (JP) ............... JP2017-126375

(51) Int. Cl.
H01L 23/373    (2006.01)

(52) U.S. Cl.
CPC ............... H01L 23/3735 (2013.01)

(58) Field of Classification Search
CPC ......... H01L 23/12; H01L 23/13; H01L 23/36; H01L 23/3735; H01L 25/07; H01L 25/18; H01L 2224/48091; H01L 2224/48227; H01L 2224/48472; H05K 3/38
See application file for complete search history.

(56) References Cited

U.S. PATENT DOCUMENTS

| | | | |
|---|---|---|---|
| 2005/0035447 A1* | 2/2005 | Basho | H01L 23/057 257/712 |
| 2009/0243089 A1* | 10/2009 | Hohlfeld | H05K 3/0061 257/734 |
| 2010/0068552 A1 | 3/2010 | Goerlich et al. | |
| 2017/0294322 A1* | 10/2017 | Morita | H01P 3/087 |

FOREIGN PATENT DOCUMENTS

| | | |
|---|---|---|
| JP | 2001-148438 A | 5/2001 |
| JP | 2007-053349 A | 3/2007 |

* cited by examiner

Primary Examiner — Allan R Wilson
(74) Attorney, Agent, or Firm — Volpe Koenig (57) ABSTRACT A power module substrate includes an insulating substrate and a metal plate. The metal plate is joined to the insulating substrate with a brazing material in between. As to surface roughness of a lateral surface of the metal plate in a thickness direction, the surface roughness of at least a corner part farthest from a center of the metal plate in plan view is larger than the surface roughness of plane parts sandwiching the corner part.

16 Claims, 9 Drawing Sheets

POWER MODULE SUBSTRATE AND POWER MODULE

TECHNICAL FIELD

The present disclosure relates to: a power module substrate in which metal plates are joined to an insulating substrate; and a power module.

BACKGROUND ART

As a circuit board that is used in an electronic device, such as a power module equipped with an electronic component(s) exemplified by an IGBT (Insulated Gate Bipolar Transistor), there has been used a power module substrate in which metal plates made of a metal material, such as copper, are joined to an insulating substrate made of a ceramic sintered body or the like.

In order to miniaturize a power module, metal plates are each manufactured by punching to have a lateral surface perpendicular to an insulating substrate, thereby reducing a space between (the lateral surfaces of) metal plates. (See, for example, Patent Literature 1.)

CITATION LIST

Patent Literature

Patent Literature 1: JP 2007-53349 A

SUMMARY OF INVENTION

A power module substrate according to an aspect of the present disclosure includes: an insulating substrate; and a metal plate joined to the insulating substrate with a brazing material in between, wherein as to surface roughness of a lateral surface of the metal plate in a thickness direction, the surface roughness of at least a corner part farthest from a center of the metal plate in plan view is larger than the surface roughness of plane parts sandwiching the corner part.

A power module according to an aspect of the present disclosure includes: the above power module substrate; and an electronic component mounted on the metal plate of the power module substrate.

Advantageous Effects of Invention

According to the power module substrate of the present disclosure, because it is configured as described above, the brazing material is restrained from climbing up at the corner part, where thermal stress tends to concentrate, and spreads much from the corner part onto the insulating substrate, so that the power module substrate has excellent joint reliability of the metal plate and the insulating substrate.

According to the power module of the present disclosure, because it includes the power module substrate configured as described above, the power module has high reliability.

DESCRIPTION OF EMBODIMENTS

A power module substrate and a power module according to an embodiment of the present disclosure will be described with reference to the drawings. It is noted that "upper" and "lower" are used in the following description for the sake of convenience, and hence not intended to limit the upper and lower sides in actual use of the power module substrate, the power module, or the like.

Figure 1:
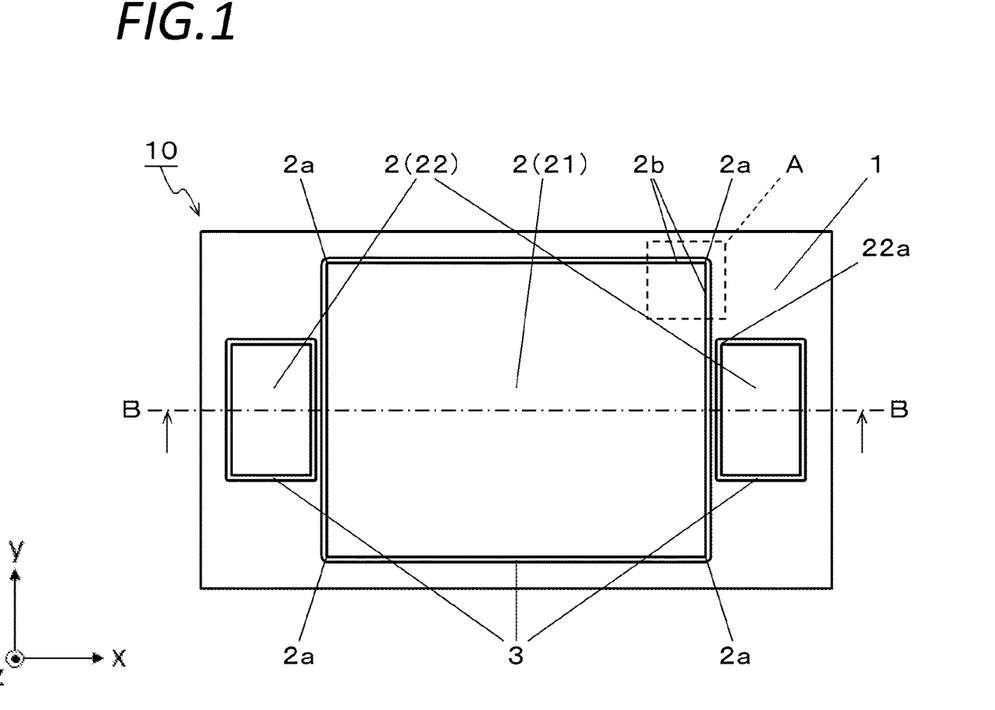
FIG. 1 is a top view showing an example of a power module substrate of the present disclosure.
Figure 2:
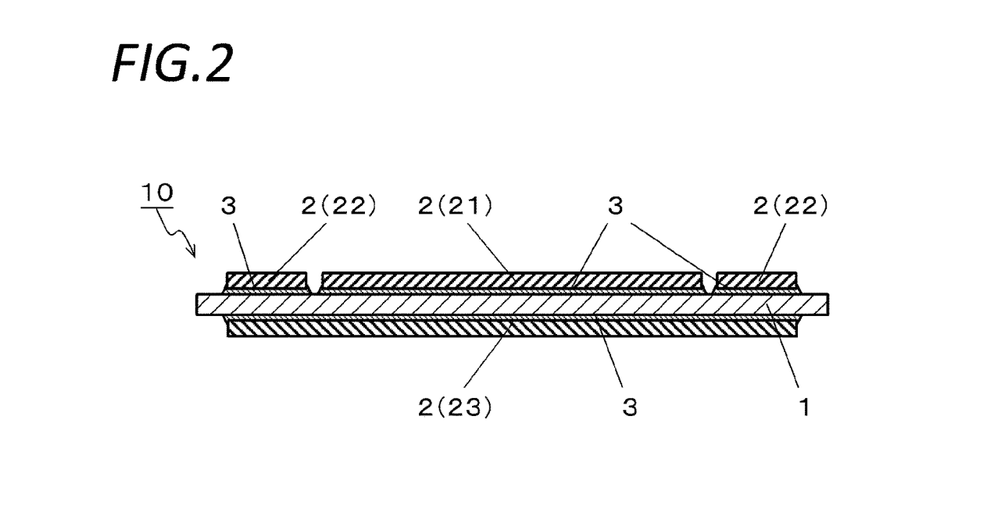
FIG. 2 is a cross-sectional view taken along a line B-B of FIG. 1.
Figure 3:
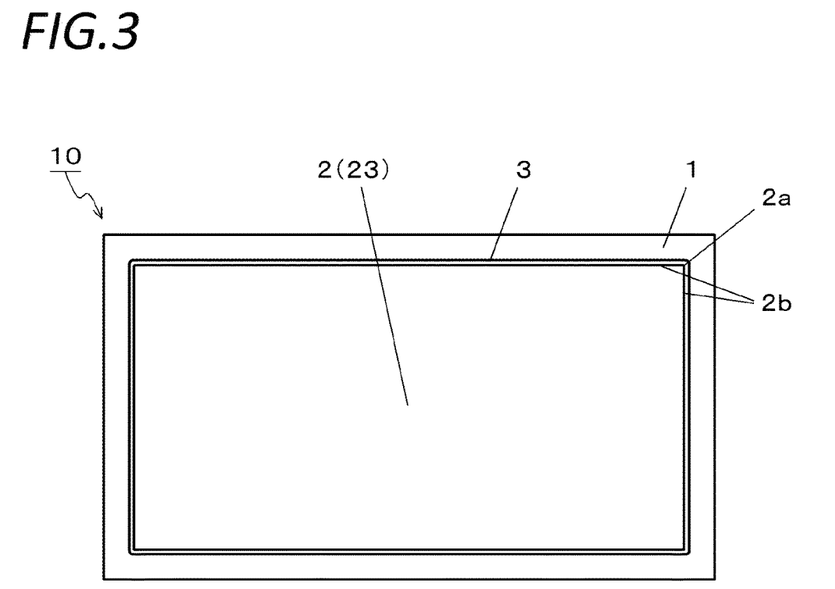
FIG. 3 is a bottom view of FIG. 1.
Figure 4:
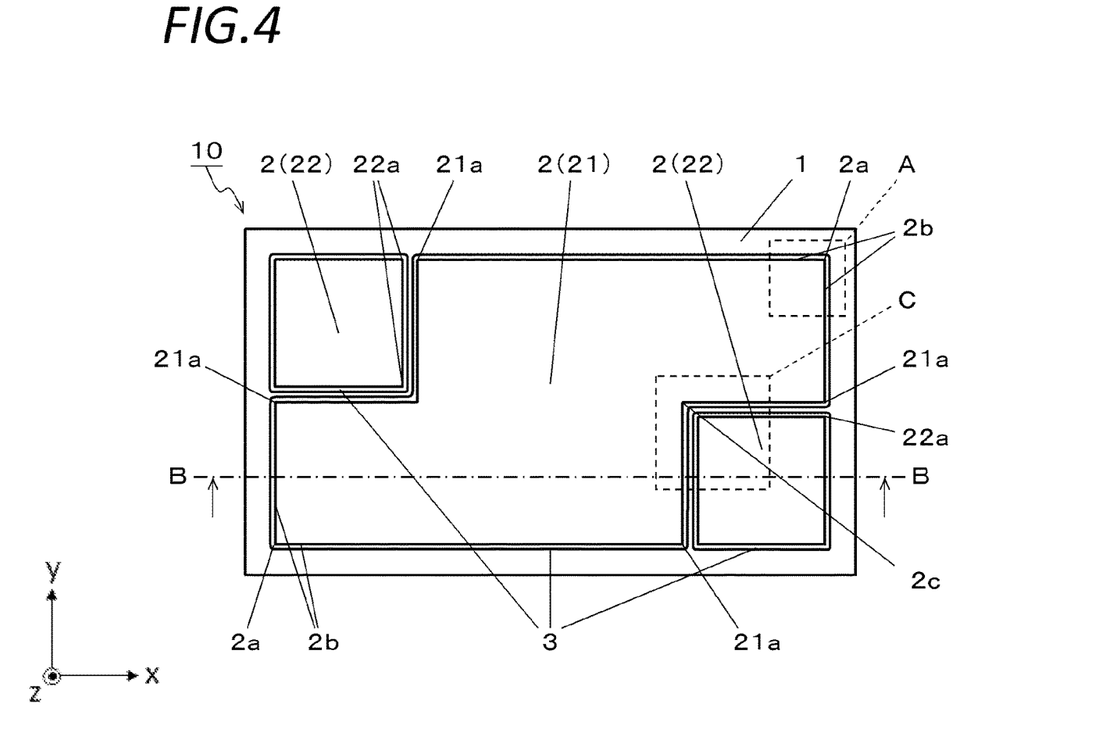
FIG. 4 is a top view showing another example of the power module substrate of the present disclosure.
Figure 5:
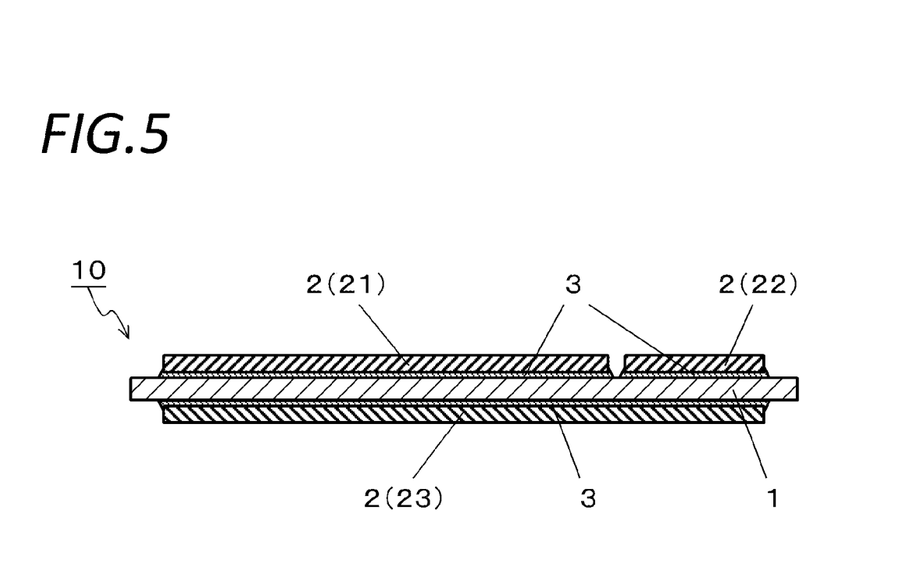
FIG. 5 is a cross-sectional view taken along a line B-B of FIG. 4.
Figure 6:
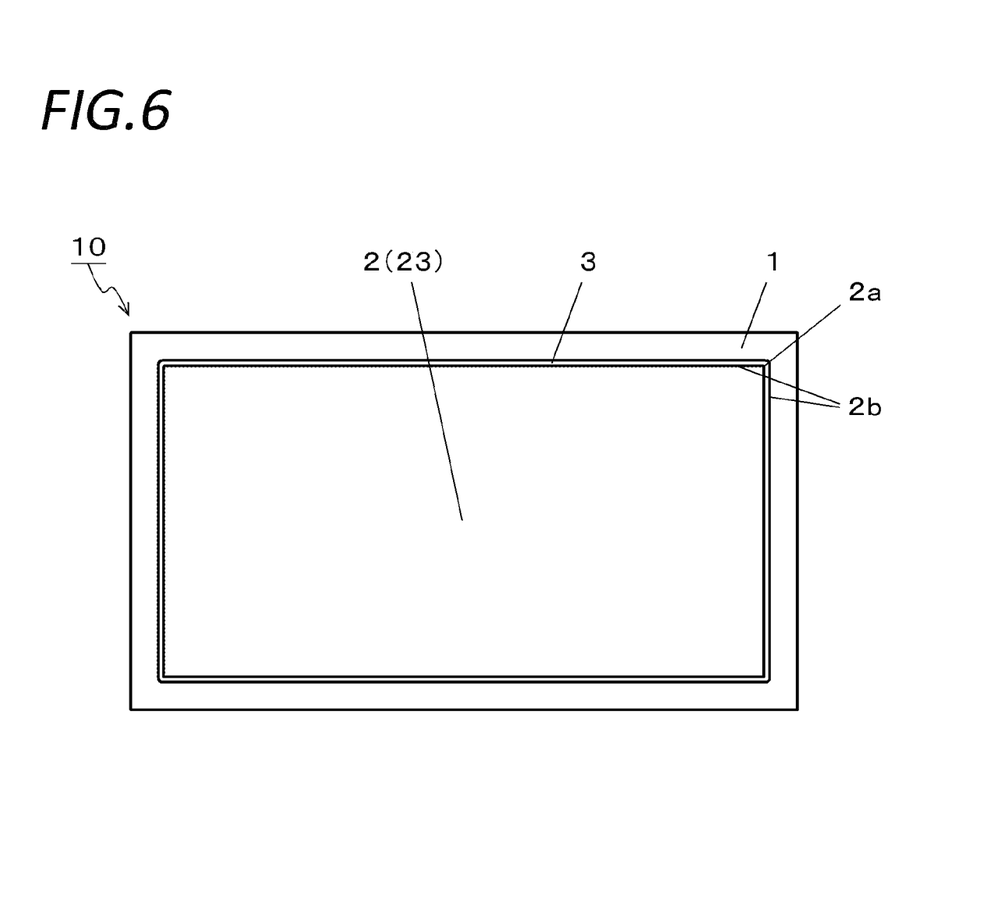
FIG. 6 is a bottom view of FIG. 4.
Figure 7:
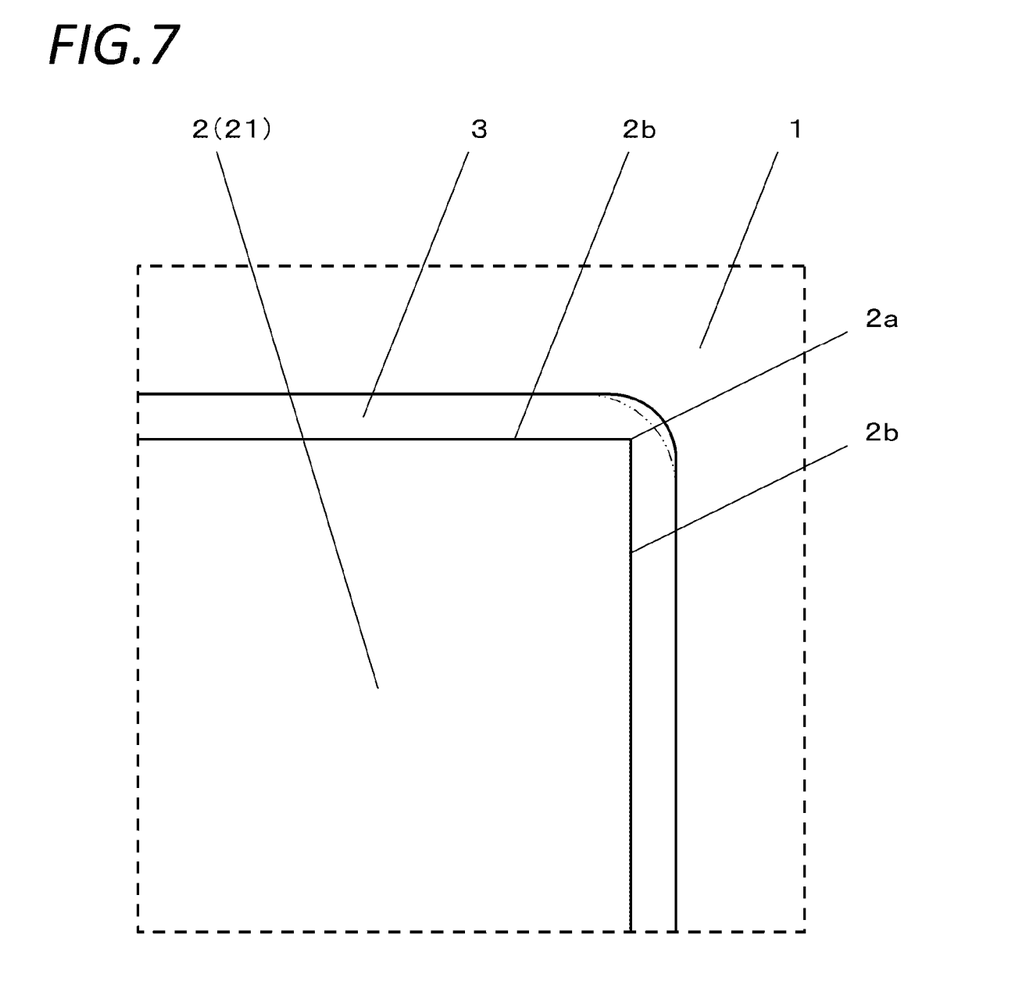
FIG. 7 shows an example of an enlarged view of a section A of FIG. 1 and FIG. 4.
Figure 8:
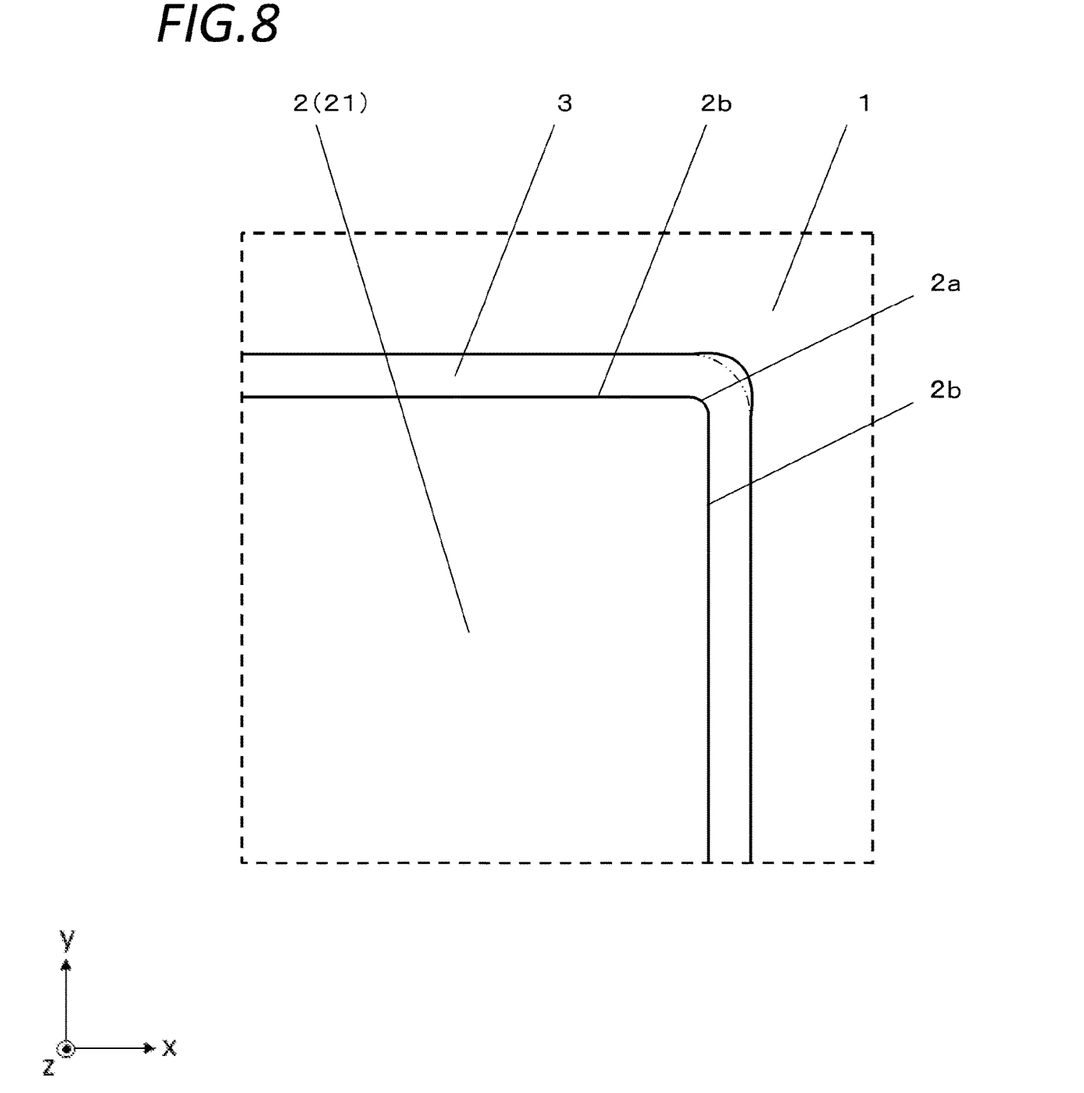
FIG. 8 shows another example of the enlarged view of the section A of FIG. 1 and FIG. 4.
Figure 9:
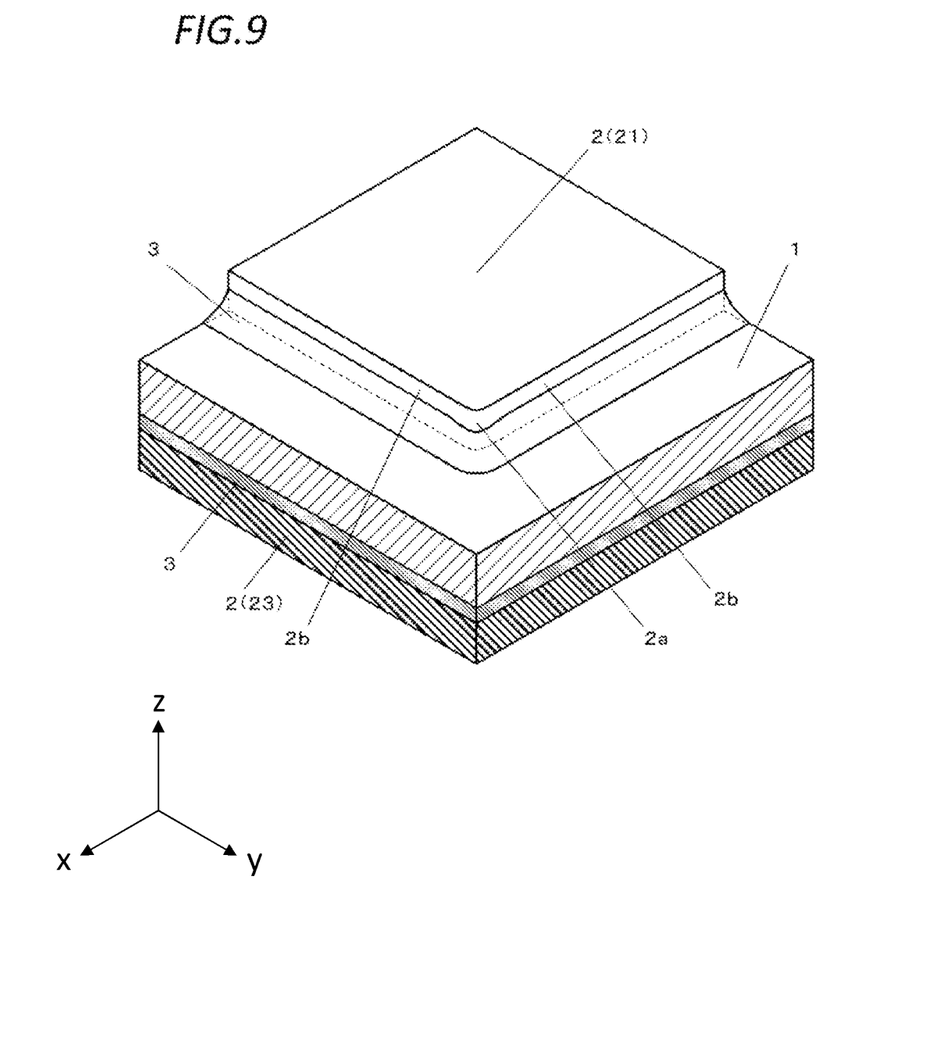
FIG. 9 is a perspective view of FIG. 8.

FIG. 1 is a top view showing an example of a power module substrate of the present disclosure. FIG. 2 is a cross-sectional view taken along a line B-B of FIG. 1. FIG. 3 is a bottom view of FIG. 1. FIG. 4 is a top view showing another example of the power module substrate of the present disclosure. FIG. 5 is a cross-sectional view taken along a line B-B of FIG. 4. FIG. 6 is a bottom view of FIG. 4. FIG. 7 and FIG. 8 show examples of an enlarged view of a section A of FIG. 1 and FIG. 4. FIG. 9 is a perspective view of FIG. 8.

A power module substrate 10 includes an insulating substrate 1 and metal plates 2 joined to main surfaces (upper and lower surfaces) of the insulating substrate 1 with brazing materials 3 in between. As to surface roughness of the lateral surface (xz-plane, yz-plane and the corner between them) of a metal plate 2, the surface roughness of at least a corner part(s) 2a farthest from the center of the metal plate 2 in plan view is larger than the surface roughness of plane parts 2b sandwiching the corner part 2a.

In a conventional power module substrate, in order to reduce a space between metal plates, a space between brazing materials, with which the metal plates are joined to an insulating substrate, also need to be reduced, and hence spread of the brazing materials from the lateral surfaces of the metal plates to the surface of the insulating substrate is also reduced. However, reducing spread of the brazing materials may lower joint reliability of the metal plates and the insulating substrate because thermal expansion difference between the metal plates and the insulating substrate may generate thermal stress, which may generate cracks in the brazing materials or the insulating substrate around, of the metal plates, corner parts where the thermal stress tends to concentrate.

The lateral surface of each metal plate 2 is located between the main surfaces (upper and lower surfaces) of the metal plate 2, and is substantially perpendicular to the both main surfaces (upper and lower surfaces). This can reduce a space between metal plates 2, and consequently produce the power module substrate 10 that is small. Each metal plate 2 is joined to the insulating substrate 1 with a brazing material 3. The brazing material 3 is interposed between the metal plate 2 and the insulating substrate 1. The brazing material 3 spreads from the lateral surface of the metal plate 2 to the surface of the insulating substrate 1, and forms a so-called meniscus-shaped fillet part. The fillet part of the brazing material 3 protrudes from the outer edge of the metal plate 2 in plan view. In order to reduce a space between metal plates 2, it is necessary to reduce the amounts of protrusion of brazing materials 3.

In a power module substrate, heat generated in a semiconductor element when, for example, the semiconductor element is mounted on the power module substrate and it is operated as a power module generates the thermal stress due to thermal expansion difference between a metal plate(s) and an insulating substrate thereof. For example, metal plates are often quadrangular in plan view, but the thermal stress tends to concentrate at the edge of each of such metal plates, in particular, immediately under corner parts thereof and at the outer end parts of a brazing material present around the corner parts. When the amount of protrusion of the brazing material is a little, the corner parts of the metal plate and the end parts of the brazing material become close to one another, so that the thermal stress concentrates more. Thus, conventional power module substrates tend to have low joint reliability of metal plates and an insulating substrate.

According to the power module substrate 10 of the present disclosure, as to the surface roughness of the lateral surface of a metal plate 2 in its thickness direction, the surface roughness of each corner part 2a of the metal plate 2 is larger than the surface roughness of plane parts 2b sandwiching the corner part 2a, so that the corner parts 2a have lower wettability of the brazing material 3 than the plane parts 2b. The brazing material 3 climbs up the lateral surface of the metal plate 2 less at the corner parts 2a than at the plane parts 2b. Hence, the brazing material spreads much from the corner parts 2a onto the insulating substrate 1. For example, in the vicinity of a corner part in a conventional power module substrate, which is uniform in surface roughness, a brazing material spreads onto an insulating substrate as indicated by a two-dot chain line in each of FIG. 7 and FIG. 8. As compared with such a conventional one, a corner part of a metal plate 2 and an end part of its brazing material 3 located outside the corner part have a long distance therebetween. This disperses the thermal stress, thereby improving the joint reliability of the metal plate 2 and the insulating substrate 1.

The "corner parts 2a" herein are salient corner parts. In each of examples shown in FIG. 1 to FIG. 3 and shown in FIG. 4 to FIG. 6, three metal plates 2 (21, 22) composed of one relatively large metal plate 2 (21) and two small metal plates 2 (22) arranged so as to sandwich the relatively large metal plate 2 (21) are joined to the upper surface of the insulating substrate 1, and one metal plate 2 (23) is joined to the lower surface of the insulating substrate 1. In the example shown in FIG. 1 to FIG. 3, all of these three metal plates 2 (21, 22) are quadrangular in plan view. On the other hand, in the example shown in FIG. 4 to FIG. 6, the metal plate 2 (21) arranged at the center part of the upper surface of the insulating substrate 1 is shaped such that a pair of quadrangular corners on a diagonal is notched. A corner part 2c on the notch part in a section C enclosed by a broken line in FIG. 4 has a re-entrant corner. The two metal plates 22 located in the two notch parts each including the re-entrant corner part 2c are quadrangular.

It is unnecessary for the surface roughness of all salient corner parts to be larger than the surface roughness of plane parts, as long as the surface roughness of at least a corner part(s) 2a farthest from the center of its metal plate 2 in plan view is larger than the surface roughness of plane parts 2b sandwiching the corner part 2a. As described above, in each of the examples shown in FIG. 1 to FIG. 3 and shown in FIG. 4 to FIG. 6, the large metal plate 2 (21) and the small metal plates 2 (22) are joined to the upper surface. For example, an electronic component (s) is mounted on the large metal plate 2 (21), and an electrode(s) of the electronic component is electrically connected to the small metal plates 2 (22) by bonding wires. Because the above-described thermal stress is larger as the joint length of a metal plate 2 and the insulating substrate 1 is longer, the thermal stress is large at the four corner parts 2a of the large quadrangular metal plate 2 (21) shown in FIG. 1 to FIG. 3. In the example shown in FIG. 4 to FIG. 6, unnotched corners on a diagonal of the large metal plate 2 (21) form the salient corner parts 2a where the thermal stress is large. Further, because the quadrangular metal plate 2 (23) joined to the lower surface of the insulating substrate 1 is also large, the four corners of this metal plate 2 (23) also form the corner parts 2a where the thermal stress is large. Each of these corner parts 2a is the corner part farthest from the center of its metal plate 2 in plan view. The center of the metal plate 2 in plan view may be referred to as the centroid of the shape of the metal plate 2 in plan view. Reducing the thermal stress at the corner parts 2a farthest from the center of the large metal plate 2 (21) among the metal plates 2 joined to the main surfaces (upper surface and lower surface) of the insulating substrate 1 is effective in improvement of the joint reliability. For that, the surface roughness of at least these corner parts 2a are larger than the surface roughness of the plane parts 2b sandwiching the corner parts 2a.

Corner parts 22a of the small metal plates 2 (22) are close to the other metal plate 2 (21), and hence, in order for the brazing materials 3 not to spread much, the surface roughness of the corner parts 22a is not large like the corner parts 2a. Further, in the example shown in FIG. 4 to FIG. 6, two salient corner parts 21a existing on the outer sides of each notch part and adjacent to the re-entrant corner part 2c are not of the corner part farthest from the center of the metal plate 2 but are close to either one of the other metal plates 2 (22), and hence the surface roughness of the corner parts 21a is not large like the corner parts 2a either. In the example shown in FIG. 4 to FIG. 6, when the notch parts keep their sizes but the small metal plates 22 are smaller, so that the salient corner parts 21a on the notch parts of the large metal plate 21 are sufficiently far away from the small metal plates 22, the surface roughness of the salient corner parts 21a on the notch parts may be large like the corner parts 2a.

The surface roughness of the lateral surface of each metal plate 2 is measured in the thickness direction of the metal plate 2 because the surface roughness in the thickness direction of the metal plate 2, which is the climbing direction of the brazing material 3, affects degree of climbing of the brazing material 3 on the lateral surface of the metal plate 2. The surface roughness of each corner part 2a does not need to be the surface roughness at the apex of a corner, but is the surface roughness of a corner part being a range that has a predetermined width and includes the apex of a corner. The corner part is a part of up to about 0.5 mm from the apex of a corner in directions toward two plane parts 2b. When a corner is rounded in plan view as shown in FIG. 8, a corner part is a part of up to about 0.5 mm from the apex of the corner in directions toward two plane parts 2b, where the apex is a point at which the two plane parts 2b extended in plan view intersect. The surface roughness of each plane part 2b is measured at a point(s) 2 mm or more away from a corner. When a corner part 2a is rounded, and its radius is larger than 0.5 mm, the surface roughness of its plane parts 2b is measured at a point(s) 1.5 mm or more away from the respective ends of the rounded part.

The surface roughness is the arithmetic mean roughness Ra, and may be measured with a laser microscope. For example, the surface roughness may be measured with a laser microscope (KV9510) manufactured by Keyence Corporation under the following conditions: a measurement range of 100 µm; a cut-off of 0.08 mm; and a measurement pitch of 0.01 µm. In each of the above-defined corner part(s) 2a and plane part (s) 2b, the surface roughness is measured at multiple points (e.g. three points), and the mean is obtained as the surface roughness of the corner part 2a or the plane part 2b. For example, when a metal plate 2 is a copper plate and has a lateral surface formed by normal punching using a die (and additional processing), and its brazing material 3 contains a silver-copper alloy as a main component, the surface roughness of each plane part 2b is, for example, 0.3 µm to 1.0 µm, and the surface roughness of each corner part 2a is, for example, 0.5 µm to 1.5 µm. When the surface roughness of the plane part 2b and the surface roughness of the corner part 2a differ, for example, by 0.1 µm or more, the abovementioned effects are obtained. Further, when the surface roughness are in the above ranges, even at the corner parts 2a, the brazing material 3 climbs up to about ⅕ to ½ of the thickness of the metal plate 2, and forms the concave meniscus-shaped fillet part from the lateral surface of the metal plate 2 to the upper surface of the insulating substrate 1, and the stress is likely to be relieved.

The power module substrate 10 may be a power module substrate in which the surface roughness gradually increases from the plane parts 2b to the corner parts 2a. In other words, the power module substrate 10 may be a power module substrate in which the surface roughness becomes smaller as the points are away from the corner parts 2a toward the plane parts 2b. In this case, wettability of the brazing material on the lateral surface of the metal plate 2 changes gradually, and as shown in FIG. 9, the height of the brazing material 3 on the lateral surface of the metal plate 2 changes gradually. The length of spread (protrusion width) of the brazing material 3 onto the insulating substrate 1 does not extremely differ between the plane parts 2b and the corner parts 2a. Hence, of the brazing material 3, part where the length of spread changes is not shaped such that the thermal stress or the like tends to concentrate. Consequently, the joint reliability of the metal plate 2 and the insulating substrate 1 has improved.

Change in the surface roughness from the plane parts 2b to the corner parts 2a in this case may be confirmed by measuring the surface roughness of the corner parts 2a and the plane parts 2b at regular intervals (e.g. 1 mm). Although the surface roughness may not keep being smaller as the points are away from the corner parts 2a owing to variations in processing or measurement, the surface roughness is smaller as the points are away from the corner parts 2a in a fitted curve of a graph showing a relationship between the surface roughness and the measurement point (distance from each corner part 2a). The change may be confirmed as follows too: divide each plane part 2b into equal regions; measure the surface roughness at multiple points in each region; and compare the means of the surface roughness in the respective regions with one another.

As described above, as shown in FIG. 8 and FIG. 9, the corner parts 2a may be convex in plan view. In this case, because the corner parts 2a each do not have a jag and hence are shaped such that the stress is less likely to concentrate, cracks or the like are hardly generated in the brazing material 3 or the insulating substrate 1 starting from the vicinities of the corner parts 2a. Consequently, the reliability is high. The corner parts 2a may each be rounded and have a radius of about 0.1 mm to 3 mm in plan view, for example. Corner parts other than the corner parts 2a having the above surface roughness may also be convex. Examples of the other corner parts include: the salient corner parts 22a of the small metal plates 22; and the salient corner parts 21a formed on the notch parts shown in FIG. 4. A corner part adjacent to another metal plate 2 being convex reduces the possibility that, between the corner part and the adjacent metal plate 2, an electric discharge occurs and the insulation decreases.

Figure 10:
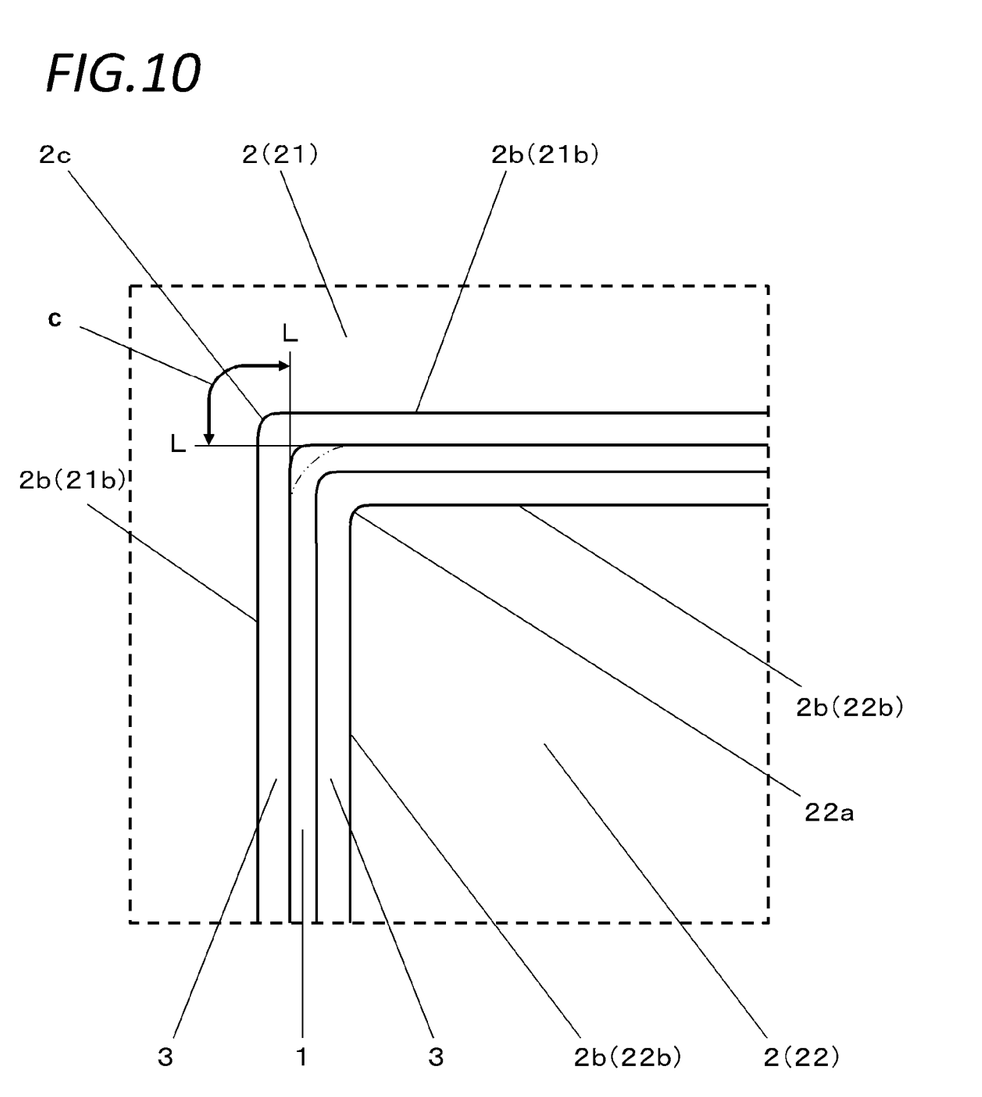
FIG. 10 shows an example of an enlarged view of a section C of FIG. 4.
Figure 11:
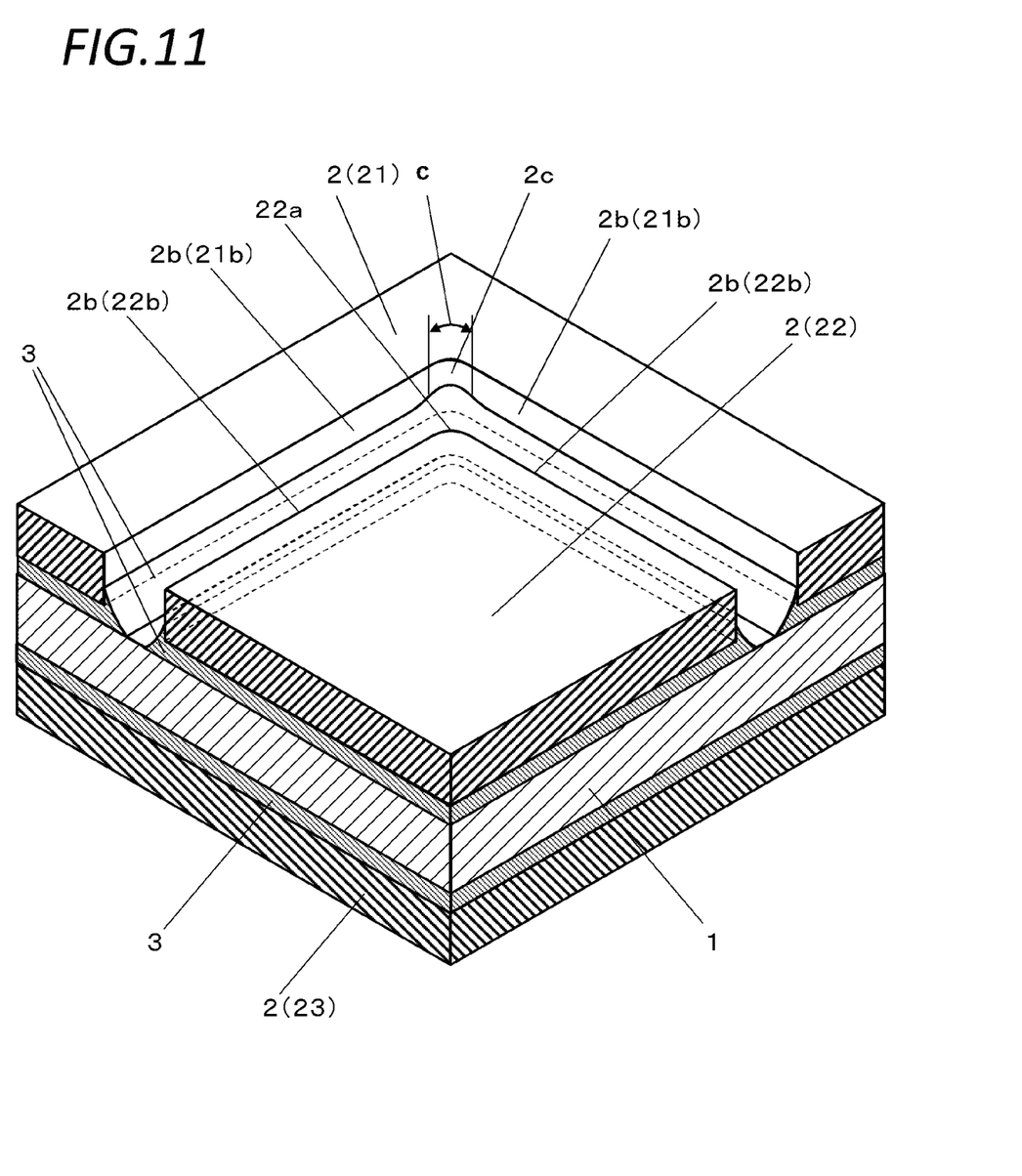
FIG. 11 is a perspective view of FIG. 10.

As shown in FIG. 4, when a metal plate 2 has re-entrant corner parts 2c, and other metal plates 2 (22) are located near the respective re-entrant corner parts 2c, the surface roughness of the re-entrant corner parts 2c may be smaller than that of the plane parts 2b. In this case, as shown in FIG. 11, the brazing material 3 climbs up more at the re-entrant corner parts 2c. Hence, the brazing material 3 spreads less from the re-entrant corner parts 2c onto the insulating substrate 1 than from the re-entrant corner parts 2c configured to have larger surface roughness (indicated by a two-dot chain line in FIG. 10). This reduces the possibility that the distances between the brazing material 3 and the other metal plates 2 arranged close to the respective re-entrant corner parts 2c become short and the insulation decreases. FIG. 10 shows an example of an enlarged view of the section C of FIG. 4. FIG. 11 is a perspective view of FIG. 10.

As shown in FIG. 10 and FIG. 11, the re-entrant corner parts 2c may be concave in plan view. In this case, the climbing height of the brazing material 3 at the re-entrant corner parts 2c tends to be higher. Further, because the re-entrant corner parts 2c each do not have a jag and hence are shaped such that the stress is less likely to concentrate, cracks or the like are hardly generated starting from the vicinities of the re-entrant corner parts 2c. Consequently, the reliability is high. The re-entrant corner parts 2c may each be concave and have a radius of about 0.1 mm to 3 mm in plan view, for example.

The measurement point for the surface roughness of each re-entrant corner part 2c is in a part of up to about 0.5 mm from the apex of its corner in directions toward two plane parts 2b (21b). When a corner is rounded in plan view as shown in FIG. 10 and FIG. 11, the measurement point is in a part of up to about 0.5 mm from the apex of the corner in directions toward two plane parts 2b (21b), where the apex is a point at which the two plane parts 2b (21b) extended in plan view intersect. More specifically, as shown in FIG. 10, a range (range c shown in FIG. 10 and FIG. 11) sandwiched between points at which imaginary extension lines (two straight lines L shown in FIG. 10) intersect with the lateral surface of the metal plate 2 (21) having a re-entrant corner part(s) 2c is defined as the re-entrant corner part 2c of the metal plate 21, where the imaginary extension lines are obtained by extending, in directions toward the corner of the re-entrant corner part 2c, straight-line parts of the outer peripheral edge of the brazing material 3 that spreads outward from the plane parts 2b (21b) of the metal plate 2 (21) having the re-entrant corner part 2c. In other words, a range of a re-entrant corner part 2c is a range from the apex of its corner toward each of its plane parts 2b (21b) by the width of the brazing material 3 present outside the plane parts 2b (21b).

The surface roughness may gradually increase from the re-entrant corner parts 2c to the plane parts 2b (21b). In this case, wettability of the brazing material on the lateral surface of the metal plate 2 changes gradually in the vicinities of the re-entrant corner parts 2c too, and as shown in FIG. 11, the height of the brazing material 3 on the lateral surface of the metal plate 2 (21) changes gradually. The length of spread of the brazing material 3 onto the insulating substrate 1 does not extremely differ between the plane parts 2b (21b) and the re-entrant corner parts 2c. Hence, of the brazing material 3, part where the length of spread changes is not shaped such that the thermal stress or the like tends to concentrate. Consequently, the joint reliability of the metal plate 2 (21) and the insulating substrate 1 has improved. The surface roughness may gradually increase from the re-entrant corner parts 2c to the plane parts 2b and then to the corner parts 2a by being combined with the above-described case where the surface roughness gradually increases from the plane parts 2b to the corner parts 2a.

Figure 12:
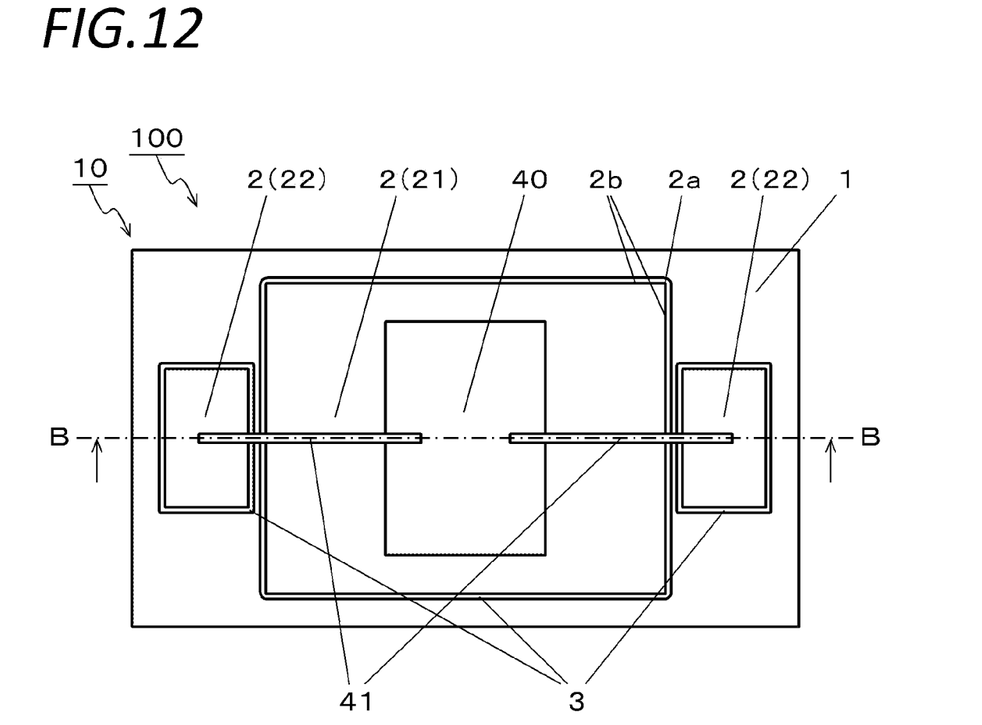
FIG. 12 is a top view showing an example of a power module of the present disclosure.
Figure 13:
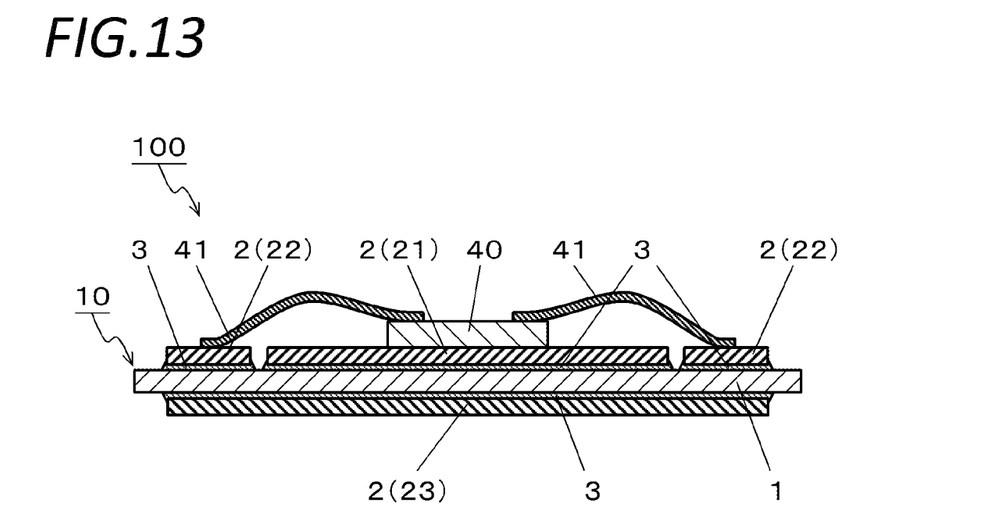
FIG. 13 is a cross-sectional view taken along a line B-B of FIG. 12.

FIG. 12 is a top view showing an example of a power module of the present disclosure. FIG. 13 is a cross-sectional view taken along a line B-B of FIG. 12. As shown in FIG. 12 and FIG. 13, a power module 100 includes the above-described power module substrate 10 and an electronic component 40 mounted on the metal plate 2 (21) of the power module substrate 10. According to the power module 100, because it includes the power module substrate 10 configured as described above, the power module 100 has high joint reliability of the metal plates 2 and the insulating substrate 1.

The power module substrate 10 shown in FIG. 12 and FIG. 13 is the same as the power module substrate 10 shown in FIG. 1 to FIG. 3, and includes one large metal plate 2 (21) and two small metal plates 2 (22) on the upper surface of the insulating substrate 1. The electronic component 40 is mounted on the large metal plate 2 (21), and electrically connected to the small metal plates 2 (22) by connective members, such as bonding wires 41. In the example shown in FIG. 12 and FIG. 13, the metal plate 21 functions as a metal plate for mounting the electronic component 40 and dissipating heat, and the metal plates 22 function as terminals for electrically connecting the electronic component 40 to external electric circuit(s) (not shown), for example. In this case, the metal plates 22 may project from the outer edge of the insulating substrate 1 in plan view. In each of the examples shown in FIG. 1 to FIG. 3 and shown in FIG. 4 to FIG. 6, the metal plate 23 is joined to the lower surface of the insulating substrate 1 with the brazing material 3. In each of the examples shown in FIG. 1 to FIG. 3 and shown in FIG. 4 to FIG. 6, the metal plate 23 is quadrangular and slightly smaller than the lower surface of the insulating substrate 1. This metal plate 23 functions as a heat dissipating plate for releasing heat generated in the electronic component 40 to the outside of the power module 100, for example. This improves heat dissipation of the power module 100, and improves long-term operational reliability of the electronic component 40. The metal plate 23 joined to the lower surface of the insulating substrate 1 may function as a circuit board for mounting the electronic component 40 or connecting the electronic component 40 to an external circuit(s).

The insulating substrate 1 is a base part for fixing and supporting the metal plates 2 in the power module substrate 10. The insulating substrate 1 functions as an insulating member for electrically insulating the metal plate 21 and the metal plates 22 on the upper surface of the insulating substrate 1 from one another, or the metal plates 21 and 22 on the upper surface of the insulating substrate 1 and the metal plate 23 on the lower surface of the insulating substrate 1 from one another.

Preferably, the insulating substrate 1 is made of a ceramic sintered body and has characteristics such as high mechanical strength and high heat transfer characteristics (cooling characteristics). As the ceramic sintered body, a known material may be used, and examples thereof include an alumina ($Al_2O_3$) sintered body, an aluminum nitride (AlN) sintered body, a silicon nitride ($Si_3N_4$) sintered body, and a silicon carbide (SiC) sintered body. As the insulating substrate 1, for example, a quadrangular plate having a length of 10 to 120 mm, a width of 10 to 120 mm, and a thickness of 0.2 to 3.0 mm may be used. Such an insulating substrate 1 may be manufactured with a known manufacturing method, for example, manufactured by: adding and mixing an organic binder or the like to and with base powder in which a sintering aid is added to alumina powder; shaping the resulting product into a substrate; and calcining the substrate.

As described above, in the power module 100, the metal plates 2 are each for mounting the electronic component 40, function as a circuit conductor that electrically connects the electronic component 40 to an external electric circuit, or function as a heat dissipating plate for dissipating heat generated in the electronic component 40. Their shapes are not particularly fixed, and are set to fit the wiring design of the power module 100. The thickness of the metal plates 2 may be set to, for example, 0.2 mm to 2.0 mm in terms of electrical resistance, strength, and heat dissipation. The number and arrangement of metal plates 2 are not limited to the examples shown in FIG. 1 to FIG. 3 and shown in FIG. 4 to FIG. 6.

The metal plates 2 are formed of a metal material, such as copper (Cu), a copper alloy, aluminum (Al), or an aluminum alloy. Pure copper or pure aluminum, which is 99% or more pure, has low electrical resistance and excellent thermal conductivity. When oxygen is contained as a component of the metal plates 2, a smaller content thereof in the metal plates 2 has an advantage in terms of improvement of the joint strength of the metal plates 2 and the bonding wires 41.

The metal plates 2 may each be manufactured by, for example, punching a metal base substrate to be a predetermined shape, and performing additional processing for adjusting the surface roughness of the lateral surface. Normal punching using a die can produce a metal plate 2 having substantially right angles formed by the lateral surface and the main surfaces. This can make the distance between metal plates 2 short in the power module substrate 10, and consequently achieve the miniaturization. The shape of each metal plate 2 can be set by the shape of a die used for punching. In the same manner, the shape of the corner parts 2a and the shape of the re-entrant corner parts 2c can be made convex and concave in plan view, respectively.

Performing additional processing on the lateral surface that has been formed by punching and where the surface roughness is relatively small can form the metal plate 2 having: the plane parts 2b the surface roughness of which is larger than that of the re-entrant corner parts 2c; and the salient corner parts 2a the surface roughness of which is larger than that of the plane parts 2b. Making degrees of additional processing, which is performed after punching, for the corner parts 2a, the plane parts 2b, and the re-entrant corner parts 2c different from one another makes degrees of the surface roughness thereof different from one another. Examples of additional processing usable include barreling and blasting. In blasting, periods of an abrasive hitting the re-entrant corner parts $2c$, the plane parts $2b$, and the salient corner parts $2a$ are made longer in this order. In either of barreling and blasting, the abrasive hitting periods may be adjusted by the following method. For example, after barreling or blasting is performed in a state in which protective films made of resin or the like are provided on the plane parts $2b$ and the re-entrant corner parts $2c$, barreling or blasting is performed again with the protective films removed, so that the surface roughness of the corner parts $2a$ is larger than that of the plane parts $2b$ and that of the re-entrant corner parts $2c$. Because the re-entrant corner parts $2c$ are less likely to be hit by an abrasive than the plane parts $2b$, processing periods of the plane parts $2b$ and the re-entrant corner parts $2c$ may be set to be equal. Such additional processing can also remove burrs generated by punching. Further, punching and additional processing can chamfer the corners formed by the upper surface and the lateral surface of the metal plate $2$, thereby forming an R plane, and consequently reduce electric discharges from the corners.

In order for additional processing to make the surface roughness of the re-entrant corner parts $2c$ smaller than the surface roughness of the plane parts $2b$, there is a usable method of, for example, adjusting the size of media (abrasive stone or abrasive) used for barreling such that the abrasive is unlikely to hit the re-entrant corner parts $2c$. For example, when media each having a diameter of 0.6 mm are used, in each re-entrant corner part $2c$ that is right-angled, the media are unlikely to hit a portion of up to about 0.3 mm from the apex of the corner, so that this portion is unlikely to be rubbed, and the other portions are likely to be rubbed. In the case of the rubbing that increases the surface roughness, the surface roughness of the re-entrant corner parts $2c$ that are less likely to be rubbed is unchanged, and the surface roughness of, for example, the plane parts $2b$ and the salient corner parts $2a$ that are likely to be rubbed becomes larger than that of the re-entrant corner parts $2c$. Because the salient corner parts $2a$ are more likely to be hit by an abrasive than the plane parts $2b$, the surface roughness of the salient corner parts $2a$ becomes larger than the surface roughness of the plane parts $2b$ by their processing periods being adjusted. The same applies to blasting, and hence the size of an abrasive may be adjusted.

The surface roughness of the lateral surfaces of the small metal plates $22$ does not need to be different from part to part. However, in order for the small metal plates $22$ and the plane parts $2b$ ($21b$) of the large metal plate $21$ to have the same degree of climbing of the brazing materials $3$ onto the lateral surfaces and the same degree of spread of the brazing materials $3$ onto the insulating substrate $1$, the small metal plates $22$ may be manufactured by the same additional processing as that performed on the plane parts $2b$ ($21b$) of the large metal plate $21$.

In order for the surface roughness of the lateral surface of the metal plate $2$ to gradually increase from the plane parts $2b$ to the corner parts $2a$, for example, barreling or blasting may be performed using the above-described protective films. For example, after barreling or blasting is performed in a state in which the plane parts $2b$ are covered with protective films, barreling or blasting is performed again with, of the protective films, part close to the corner parts $2a$ ($21a$) removed. This makes the processing amount (degree of rubbing) of additional processing different from part to part.

In order for the surface roughness to gradually increase from the re-entrant corner parts $2c$ to the plane parts $2b$ ($21b$) and then to the corner parts $2a$ ($21a$), the following may be repeated: perform additional processing with the re-entrant corner parts $2c$ and the plane parts $2b$ ($21b$) covered with protective films; and perform additional processing again with, of the protective films, part close to the corner parts $2a$ ($21a$) removed. In barreling described above, multiple media having different sizes may be used. For example, when second media each having a diameter of 3 mm are used in addition to first media each having a diameter of 0.6 mm, which are described above, in each re-entrant corner part $2c$, both the first media and the second media are unlikely to hit a portion of up to about 0.3 mm from the apex of the corner; the first media are likely but the second media are unlikely to hit a portion of up to about 1.5 mm from about 0.3 mm away from the apex of the corner; and both the first media and the second media are likely to hit a portion of about 1.5 mm or more away from the apex of the corner. As the portion is away from the re-entrant corner part $2c$, more media hit the portion, and the portion is rubbed accordingly, which gradually increases the surface roughness. The state of change in the surface roughness can be adjusted by the size, the number of sizes, the mixing ratio, and so forth of media to be combined. Media having different shapes and/or media having different materials can also be used in combination. The same applies to blasting.

The metal plates $2$ are joined (brazed) to the insulating substrate $1$ with the brazing materials $3$. As the brazing materials $3$, for example, when the metal plates $2$ are made of copper (Cu) or a copper alloy, an active metal-containing brazing material in which an active metal, such as titanium (Ti), hafnium (Hf), or zirconium (Zr), is contained in a silver-copper (Ag—Cu) alloy brazing material may be used, whereas when the metal plates $2$ are made of aluminum (Al) or an aluminum alloy, an aluminum-silicon (Al—Si) alloy brazing material or an aluminum-germanium (Al—Ge) alloy brazing material may be used. The metal plates $2$ are joined (brazed) to the insulating substrate $1$ by: applying a brazing material paste to the insulating substrate $1$ with a method such as screen printing; placing the metal plates $2$ thereon; and heating the resulting product in a pressurized state.

The brazing materials $3$ each spread from the outer edge of the metal plate $2$ onto the insulating substrate $1$ in plan view, and the spread width of the brazing material $3$, namely the distance from the outer edge of the metal plate $2$ to the outer edge of the brazing material $3$ in plan view, is, for example, about 0.05 mm to 0.5 mm. The space between the metal plate $2$ ($21$) and another metal plate $2$ ($22$) is, for example, about 0.8 mm to 2.0 mm. The distance (space) between the outer edges of the brazing materials $3$ present between the metal plates $2$ adjacent to one another is, for example, 0.5 mm to 1.0 mm. When the spaces between the brazing materials $3$ and between the metal plates $2$ are in the above ranges, the possibility of poor insulation between the metal plates $2$ adjacent to one another is reduced. Also, because the spaces are sufficiently small, the power module substrate $10$ and the power module $100$ can be made small.

When the metal plate $23$ on the lower surface of the insulating substrate $1$ functions as a heat dissipating plate as described above, the metal plate $23$ on the lower surface may be set to have a size, in plan view, equal to or larger than the whole of the metal plates $2$ ($21$ and $22$) on the upper surface but smaller than the insulating substrate $1$, for example. The metal plate $23$ on the lower surface having about the same size as that defined by connecting the outer edges of the metal plates $2$ ($21$ and $22$) on the upper surface reduces thermal stress difference between the upper side and the lower side of the insulating substrate $1$. This has an advantage in restraint of warpage of the power module substrate 10. The metal plate 23 on the lower surface being smaller than the insulating substrate 1 improves the electrical insulation between the metal plate 23 on the lower surface and the metal plates 2 (21 and 22) on the upper surface. The metal plate 23 on the lower surface being larger than the metal plates 2 (21 and 22) on the upper surface, namely the outer edge of the metal plate 23 being located outside the outer edge of the metal plates 2 (21 and 22) on the upper surface in see-through plan view, effectively diffuses heat in the horizontal direction of the metal plate 23 on the lower surface, the heat being generated during use of the power module 100. This has an advantage in improvement of heat dissipation. When it is desired to further improve the heat dissipation, the metal plate 23 on the lower surface may be made larger than the insulating substrate 1. In this case, the metal plates 2 (21 and 22) on the upper surface are joined to the insulating substrate 1 so as to be located inside the outer edge of the insulating substrate 1, and hence certainly insulated from the metal plate 23 on the lower surface.

On the surfaces of the metal plates 2 (21, 22, 23), plating layers may be formed to protect the surfaces or to improve the joining property of the brazing materials 3, the bonding wires 41, and so forth. The plating layers may each be a metal plating layer of palladium, nickel, silver, or the like.

The power module substrate 10 may be manufactured as follows: manufacture a product with a so-called multi-cavity form; and divide the product.

By mounting the electronic component 40 on the power module substrate 10, the power module 100 shown in FIG. 12 and FIG. 13 as an example is made. The electronic component 40 is, for example, a power semiconductor device, such as an IGBT. The electronic component 40 is joined and fixed to a metal plate 2 by, for example, soldering, brazing or diffusion bonding. In the example shown in FIG. 12 and FIG. 13, the electronic component 40 is fixed to the large metal plate 21 joined to the upper surface of the insulating substrate 1, and is electrically connected to the small metal plates 22 on the upper surface by the bonding wires 41 made of aluminum, gold (Au), or the like. The power module 100 may be, for example, housed in a case, or housed in a case and covered with resin. At the bottom of the case, a heat sink may be arranged, and the metal plate 23 on the lower surface of the power module substrate 10 and the heat sink may be joined to one another with a heat-transfer material, for example, heat-transfer grease, to enhance heat dissipation.

The power module substrate 10 and the power module 100 are not limited to the examples described in the above embodiment, and can be variously modified within the scope of the present disclosure.

REFERENCE SIGNS LIST

1 Insulating Substrate
2 (21, 22, 23) Metal Plate
2a (21a, 22a) Corner Part
2b (21b, 22b) Plane Part
2c Re-entrant Corner Part
3 Brazing Material
10 Power Module Substrate
40 Electronic Component
41 Bonding Wire
100 Power Module

The invention claimed is:

1. A power module substrate comprising:
an insulating substrate; and
a metal plate joined to the insulating substrate with a brazing material in between, wherein
a lateral surface of the metal plate includes corner parts and plane parts, the plane parts sandwiching a corner part of the corner parts, and
at least at the corner part farthest from a center of the metal plate in plan view, a surface roughness of the lateral surface of the metal plate is larger than the surface roughness at the plane parts sandwiching the corner part.

2. The power module substrate according to claim 1, wherein the surface roughness gradually increases from the plane parts to the corner part.

3. The power module substrate according to claim 1, wherein the corner part is convex in plan view.

4. A power module comprising:
the power module substrate according to claim 1, and
an electronic component mounted on the metal plate of the power module substrate.

5. The power module substrate according to claim 2, wherein the corner part is convex in plan view.

6. A power module comprising:
the power module substrate according to claim 2; and
an electronic component mounted on the metal plate of the power module substrate.

7. A power module comprising:
the power module substrate according to claim 3; and
an electronic component mounted on the metal plate of the power module substrate.

8. The power module substrate according to claim 1, further comprising
two small metal plates, and
wherein the two small metal plates are smaller than the metal plate.

9. The power module substrate according to claim 8, wherein
the two small metal plates are arranged such that the metal plate is between the two small metal plates on the insulating substrate.

10. The power module substrate according to claim 1, wherein on a diagonal, a pair of quadrangular corners of the metal plate are notched.

11. The power module substrate according to claim 10, further comprising
two small metal plates, and
wherein the two small metal plates are arranged in the notch of the pair of quadrangular corners of the metal plate.

12. The power module substrate according to claim 3, wherein a radius of the corner part is 0.1 to 3 mm in plan view.

13. The power module substrate according to claim 1, wherein the surface roughness at the plane parts of the lateral surface is 0.3 µm to 1.0 µm, the surface roughness being arithmetic mean roughness Ra.

14. The power module substrate according to claim 1, wherein the surface roughness at the corner part of the lateral surface is 0.5 µm to 1.5 µm, the surface roughness being arithmetic mean roughness Ra.

15. The power module substrate according to claim 1, further comprises
a meniscus-shaped fillet part between the lateral surface and an upper surface of the insulating substrate formed by the brazing material.

16. The power module substrate according to claim 1, wherein in a thickness direction, the surface roughness of the lateral surface of the metal plate at the corner part is larger than the surface roughness at the plane parts sandwiching the corner part.

\* \* \* \* \*